United States Patent
Jamann et al.

(10) Patent No.: US 8,539,423 B2
(45) Date of Patent: Sep. 17, 2013

(54) SYSTEMATIC BENCHMARKING SYSTEM AND METHOD FOR STANDARDIZED DATA CREATION, ANALYSIS AND COMPARISON OF SEMICONDUCTOR TECHNOLOGY NODE CHARACTERISTICS

(71) Applicant: Agere Systems LLC, Wilmington, DE (US)

(72) Inventors: Joseph J. Jamann, Allentown, PA (US); James C. Parker, Allentown, PA (US); Vishwas M. Rao, Milpitas, CA (US)

(73) Assignee: Agere Systems, LLC, Wilmington, DE (US)

( * ) Notice: Subject to any disclaimer, the term of this patent is extended or adjusted under 35 U.S.C. 154(b) by 0 days.

(21) Appl. No.: 13/649,996

(22) Filed: Oct. 11, 2012

(65) Prior Publication Data

US 2013/0104096 A1    Apr. 25, 2013

Related U.S. Application Data

(60) Division of application No. 13/212,427, filed on Aug. 18, 2011, now Pat. No. 8,307,324, which is a continuation of application No. 12/365,084, filed on Feb. 3, 2009, now Pat. No. 8,024,694.

(60) Provisional application No. 61/126,881, filed on May 7, 2008.

(51) Int. Cl.
*G06F 17/50* (2006.01)

(52) U.S. Cl.
USPC ........... 716/133; 716/132; 716/134; 716/135; 716/136

(58) Field of Classification Search
USPC .................................................. 716/132–136
See application file for complete search history.

(56) References Cited

U.S. PATENT DOCUMENTS

| | | |
|---|---|---|
| 5,050,091 A | 9/1991 | Rubin |
| 5,175,696 A | 12/1992 | Hooper et al. |
| 5,278,769 A | 1/1994 | Bair et al. |
| 5,692,160 A | 11/1997 | Sarin |
| 5,778,216 A | 7/1998 | Venkatesh |
| 5,808,901 A | 9/1998 | Cheng et al. |
| 5,812,416 A | 9/1998 | Gupte et al. |
| 6,011,911 A | 1/2000 | Ho et al. |
| 6,044,211 A | 3/2000 | Jain |

(Continued)

OTHER PUBLICATIONS

Beenker, F., et al., "A Testability Strategy for Silicon Compilers," 1989 International Test Conference, IEEE, pp. 660-669.

(Continued)

*Primary Examiner* — Naum Levin

(57) ABSTRACT

One aspect provides a method of designing an integrated circuit. In one embodiment, the method includes: (1) generating a functional design for the integrated circuit, (2) determining performance objectives for the integrated circuit, (3) determining an optimization target voltage for the integrated circuit, (4) determining whether the integrated circuit needs voltage scaling to achieve the performance objectives at the optimization target voltage and, if so, whether the integrated circuit is to employ static voltage scaling or adaptive voltage scaling, (5) using the optimization target voltage to synthesize a layout from the functional integrated circuit design that meets the performance objectives by employing standardized data created by designing at least one representative benchmark circuit, and (6) performing a timing signoff of the layout at the optimization target voltage.

10 Claims, 9 Drawing Sheets

(56) References Cited

U.S. PATENT DOCUMENTS

| | | | |
|---|---|---|---|
| 6,145,117 A | 11/2000 | Eng | |
| 6,216,252 B1 | 4/2001 | Dangelo et al. | |
| 6,324,679 B1 | 11/2001 | Raghunathan et al. | |
| 6,480,991 B1 | 11/2002 | Cho et al. | |
| 6,658,628 B1 | 12/2003 | Landy et al. | |
| 6,751,786 B2 | 6/2004 | Teng et al. | |
| 6,766,503 B2 | 7/2004 | Fizhenry et al. | |
| 6,845,494 B2 | 1/2005 | Burks et al. | |
| 6,865,726 B1 | 3/2005 | Igusa et al. | |
| 6,927,619 B1* | 8/2005 | Doyle | 327/534 |
| 6,928,630 B2 | 8/2005 | Moon et al. | |
| 6,952,812 B2 | 10/2005 | Abadir et al. | |
| 7,010,475 B2 | 3/2006 | Ehrler | |
| 7,010,763 B2 | 3/2006 | Hathaway et al. | |
| 7,093,208 B2 | 8/2006 | Williams et al. | |
| 7,103,863 B2 | 9/2006 | Riepe et al. | |
| 7,111,269 B2 | 9/2006 | Satapathy et al. | |
| 7,127,384 B2 | 10/2006 | Zolotov et al. | |
| 7,146,583 B1 | 12/2006 | Sun et al. | |
| 7,356,451 B2 | 4/2008 | Moon et al. | |
| 7,417,482 B2 | 8/2008 | Elgebaly et al. | |
| 7,421,671 B2 | 9/2008 | Korobkov | |
| 7,653,884 B2 | 1/2010 | Furnish et al. | |
| 7,669,155 B2 | 2/2010 | Ganesan et al. | |
| 7,669,157 B1 | 2/2010 | Borer et al. | |
| 7,675,317 B2 | 3/2010 | Perisetty | |
| 7,714,610 B2 | 5/2010 | He | |
| 7,716,023 B2 | 5/2010 | Barker et al. | |
| 7,725,848 B2 | 5/2010 | Nebel et al. | |
| 7,810,056 B1 | 10/2010 | Garg et al. | |
| 7,865,850 B1 | 1/2011 | Kao et al. | |
| 7,919,475 B2 | 4/2011 | Dillmann et al. | |
| 8,024,649 B1 | 9/2011 | Morio et al. | |
| 8,024,694 B2 | 9/2011 | Jamann et al. | |
| 8,122,399 B2 | 2/2012 | Bowers et al. | |
| 8,122,422 B2 | 2/2012 | Rao et al. | |
| 8,127,264 B2 | 2/2012 | Parker et al. | |
| 8,181,144 B2 | 5/2012 | Tetelbaum | |
| 8,239,798 B1 | 8/2012 | Goyal et al. | |
| 8,239,805 B2 | 8/2012 | Rao et al. | |
| 8,281,266 B2* | 10/2012 | Jamann et al. | 716/108 |
| 8,307,324 B2* | 11/2012 | Jamann et al. | 716/132 |
| 2002/0112213 A1* | 8/2002 | Abadir et al. | 716/4 |
| 2004/0044510 A1 | 3/2004 | Zolotov et al. | |
| 2005/0257178 A1 | 11/2005 | Daems et al. | |
| 2007/0096775 A1* | 5/2007 | Elgebaly et al. | 327/105 |
| 2007/0244676 A1 | 10/2007 | Shang et al. | |
| 2008/0162770 A1* | 7/2008 | Titiano et al. | 710/309 |
| 2008/0195359 A1* | 8/2008 | Barker et al. | 703/2 |
| 2008/0307240 A1* | 12/2008 | Dahan et al. | 713/320 |
| 2009/0254874 A1 | 10/2009 | Bose | |
| 2010/0026378 A1 | 2/2010 | Parker et al. | |
| 2010/0037188 A1 | 2/2010 | Jamann et al. | |
| 2010/0095259 A1* | 4/2010 | Tetelbaum | 716/6 |
| 2011/0022998 A1 | 1/2011 | Rao et al. | |
| 2011/0138347 A1 | 6/2011 | Tetelbaum | |
| 2011/0307852 A1 | 12/2011 | Jamann et al. | |
| 2012/0174048 A1 | 7/2012 | Rao et al. | |
| 2013/0055175 A1 | 2/2013 | Jamann et al. | |

OTHER PUBLICATIONS

Benaben, F., et al., "A UML-based complex system design method MoFoV (Modeling/Formalizing/Verifying)," IEEE, 2002, 6 pages.

Hedenstierna, N., et al., "The Halo Algorithm—An Algorithm for Hierarchical Design of Rule Checking of VLSI Circuits," IEEE Transactions on Computer-Aided Design of Integrated Circuits and Systems, vol. 12, No. 2, Feb. 1993, pp. 265-272.

Mathur, A., et al., "Power Reduction Techniques and Flows at RTL and System Level," 2009 22nd Interarntional Conferecne on VLSI Design, IEEE Computer Society, pp. 28-29.

McGrath, E. J., et al., "Design Integrity and Immunity Checking: A New Look at Layout Verfication and Design Rule Checking," 1980 ACM, pp. 263-268.

Saputra, H., et al., "Energy-Conscious Compilation Based on Voltage Scaling," Proceedings of LCTES02, Jun. 19-21, 2002, 10 pages.

Snowdon, D., et al., "Power Management and Dynamic Voltage Scaling: Myths and Facts," National ICT Australia and School of Computer Science and Engineering, Sep. 16, 2005, 7 pages.

Wagner, T. J., "Hierarchical Layout Verification," IEEE, Feb. 1985, pp. 31-37.

Courtoy, M., et al., "Physical Prototyping Plans for High Performance Early Planning and Analysis for Area, Timing, Routability, Clocking, Power and Signal Integrity", 2004, Closing the Gap Between ASIC & Custom, Chapter 6, pp. 169-186.

* cited by examiner

FIG. 6I
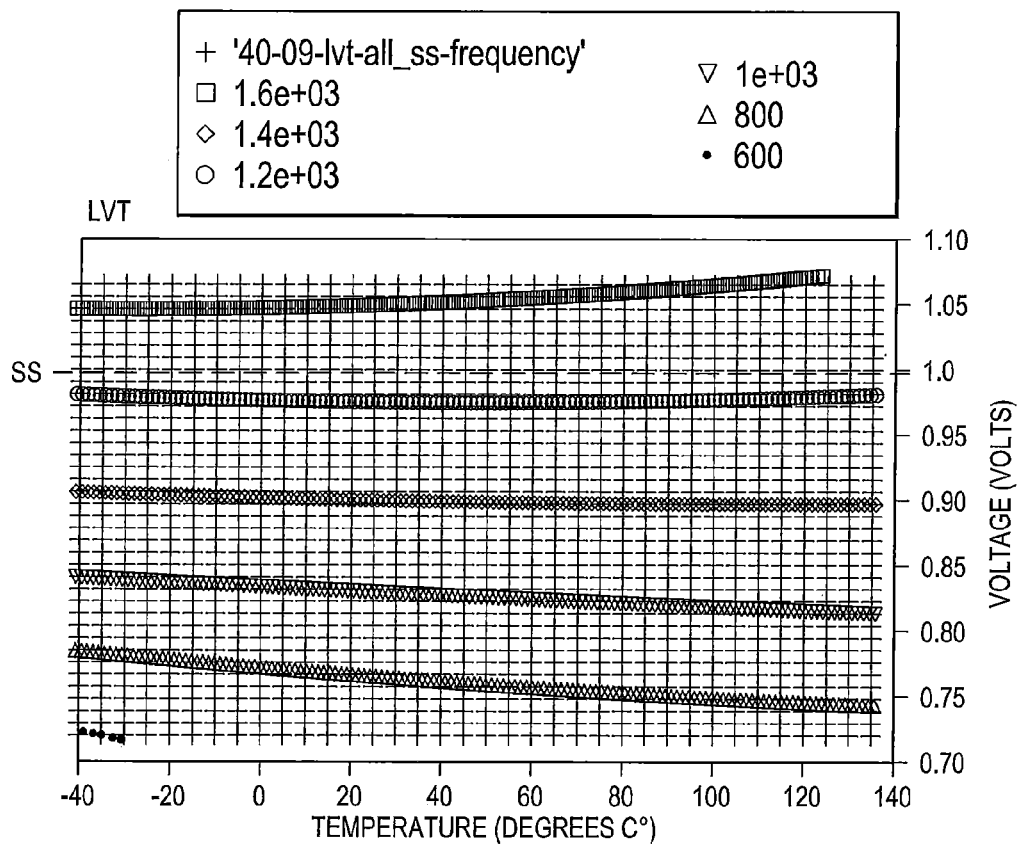
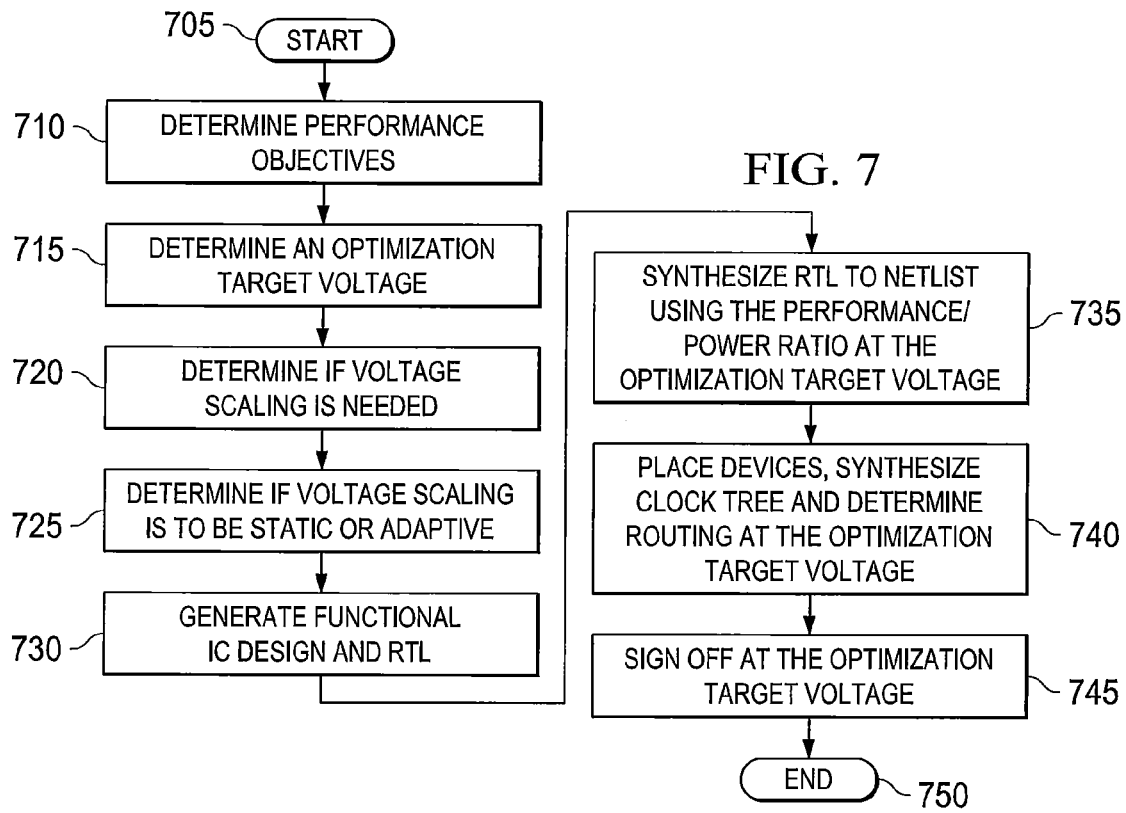
FIG. 7

SYSTEMATIC BENCHMARKING SYSTEM AND METHOD FOR STANDARDIZED DATA CREATION, ANALYSIS AND COMPARISON OF SEMICONDUCTOR TECHNOLOGY NODE CHARACTERISTICS

CROSS-REFERENCE TO RELATED APPLICATIONS

This application is a divisional of U.S. patent application Ser. No. 13/212,427, to Joseph J. Jamann, entitled "A SYSTEMATIC BENCHMARKING SYSTEM AND METHOD FOR STANDARDIZED DATA CREATION, ANALYSIS AND COMPARISON OF SEMICONDUCTOR TECHNOLOGY NODE CHARACTERISTICS," filed on Aug. 18, 2011 which has issued at U.S. Pat. No. 8,307,324 on Nov. 5, 2012 and is a continuation of U.S. patent application Ser. No. 12/365,084, to Joseph J. Jamann, entitled "A SYSTEMATIC BENCHMARKING SYSTEM AND METHOD FOR STANDARDIZED DATA CREATION, ANALYSIS AND COMPARISON OF SEMICONDUCTOR TECHNOLOGY NODE CHARACTERISTICS," filed on Feb. 3, 2009, which has issued as U.S. Pat. No. 8,024,694 on Sep. 20, 2011, and claims the benefit of U.S. Provisional Application Ser. No. 61/126,881, filed by Parker, et al., on May 7, 2008, entitled "A Novel Paradigm for Optimizing Performance, Power, Area and/or Yield in Integrated Circuits." The present application is also related to U.S. application Ser. No. 12/364,918 filed by Parker, et al., on Feb. 3, 2009, entitled "Methods for Designing Integrated Circuits Employing Voltage Scaling and Integrated Circuits Designed Thereby" and U.S. application Ser. No. 12/365,010 filed by Jamann, et al., on Feb. 3, 2009, entitled "A Systematic, Normalized Metric for Analyzing and Comparing Optimization Techniques for Integrated Circuits Employing Voltage Scaling and Integrated Circuits Designed Thereby" which issued as U.S. Pat. No. 8,281,266 on Oct. 2, 2012. The above applications are commonly assigned with the invention and incorporated herein by reference.

TECHNICAL FIELD

This application is directed, in general, to a integrated circuits (ICs) and, more specifically, to a systematic benchmarking system and method for standardized data creation, analysis and comparison of semiconductor technology node characteristics.

BACKGROUND

Conserving resources, including energy, has become a preeminent objective in today's world. Manufacturers of ICs are sensitive to the need to improve the energy efficiency of their products. Those skilled in the pertinent art are aware that various measures may be taken in an electronic circuit to reduce its power consumption. One measure is to use cells (i.e., logic elements including devices, e.g., transistors) that leak less current when turned off. Another measure is to use a lower voltage to drive the cells. Unfortunately, using lower leakage current cells or lower drive voltages almost always reduces the speed at which signals propagate through the circuit. Consequently, the circuit may not operate as fast as needed or desired.

Area and yield are also important considerations in circuit design. IC fabrication cost generally decreases as IC substrate ("die") size decreases. Increasing yield means decreasing scrap, which by definition reduces overall IC fabrication cost.

Circuit designers use electronic design automation (EDA) tools, a category of computer aided design (CAD) tools, to create a functional circuit design, including a register transfer logic (RTL representation) representation of the functional circuit design, generate a "netlist" from the RTL representation, and synthesize a layout from the netlists. Synthesis of the layout involves simulating the operation of the circuit and determining where cells should be placed and where the interconnects that couple the cells together should be routed. EDA tools allow designers to construct a circuit, simulate its performance, determine its power consumption and area and predict its yield using a computer and without requiring the costly and lengthy process of fabrication. EDA tools are indispensable for designing modern ICs, particularly very-large-scale integrated circuits (VSLIs). For this reason, EDA tools are in wide use.

One such EDA tool performs timing signoff. Timing signoff is one of the last steps in the IC design process and ensures that signal propagation speed in a newly-designed circuit is such that the circuit will operate as intended. Signals that propagate too slowly through the circuit cause setup violations; signals that propagate too quickly through the circuit cause hold violations. Setup or hold violations frustrate the logic of the circuit and prevent it from performing the job it was designed to do.

Timing signoff is performed with highly accurate models of the circuit under multiple sets of assumptions regarding expected variations, called "PVT corners." Process-voltage-temperature (PVT) PVT corners are based on assumptions regarding variations in device operation from one IC to another, drive voltage and operating temperature. Resistance-capacitance (R, C, or RC) PVT corners are based on assumptions regarding variations in one or both of interconnect resistance and capacitance from one IC to another. Conventional timing signoff identifies setup and hold violations in a "slow" PVT corner (in which process variations are assumed to yield relatively slow-switching devices, and drive voltage and operating temperature are such that device switching speeds are their slowest) and a "worst" RC corner (in which process variations are assumed to yield interconnects having relatively high resistance and capacitance). Conventional timing signoff also identifies hold violations in a "fast" PVT corner (in which process variations are assumed to yield relatively fast-switching devices, and drive voltage and operating temperature are such that device switching speeds are their fastest) and a "best" RC corner (in which process variations are assumed to yield interconnects having relatively low resistance and capacitance). Conventional signoff timing also takes on-chip variations (OCV), which are process variations occurring over the area of a given IC, into account using statistical methods. The fast PVT and best RC corner are sometimes jointly referred to as a fast-fast (FF) or best-case fast (BCF) corner, and the slow PVT and worst RC corner are sometimes jointly referred to as a slow-slow (SS) or worst-case slow (WCS) corner. Various PVT and RC corners may also be defined where devices and interconnects are most often fabricated and operated. Those corners may be called typical-typical (TT) corners.

Thus a fundamental tradeoff exists among speed and power consumption. Further considerations involve speed, power consumption, area and yield. These force the circuit designer to employ EDA tools, particularly timing signoff, to strike a delicate balance. Tempering the designer's zeal are the above-described process and environmental variations to which every production circuit is subject. These variations increase the degree to which the designer must ensure that production circuits work under real-world operating conditions and therefore the complexity of timing signoff.

Further complicating the designer's task is the difficulty of determining the consequences of design choices, particularly when they involve different technology nodes or technology nodes. In other words, a designer may not have the information needed to make optimal decisions regarding the technology node or nodes to employ to fabricate a particular IC design.

SUMMARY

One aspect provides a method of designing an integrated circuit. In one embodiment, the method includes: (1) generating a functional design for the integrated circuit, (2) determining performance objectives for the integrated circuit, (3) determining an optimization target voltage for the integrated circuit, (4) determining whether the integrated circuit needs voltage scaling to achieve the performance objectives at the optimization target voltage and, if so, whether the integrated circuit is to employ static voltage scaling or adaptive voltage scaling, (5) using the optimization target voltage to synthesize a layout from the functional integrated circuit design that meets the performance objectives by employing standardized data created by designing at least one representative benchmark circuit, establishing standard sensitization and measurement rules for delay and power for the at least one representative benchmark circuit and across corners in the technology nodes, performing a simulation by sweeping through a range of values and at predetermined intervals across the corners, extracting data from the simulation, and parsing and interpreting the data to produce at least one report and (6) performing a timing signoff of the layout at the optimization target voltage.

In another embodiment, the method includes: (1) generating a functional design for the integrated circuit, (2) determining performance objectives for the integrated circuit, (3) determining an optimization target voltage for the integrated circuit, (4) determining whether the integrated circuit needs voltage scaling to achieve the performance objectives at the optimization target voltage and, if so, whether the integrated circuit is to employ static voltage scaling or adaptive voltage scaling, (5) using the optimization target voltage to synthesize a layout from the functional integrated circuit design that meets the performance objectives by employing standardized data created by designing at least one representative benchmark circuit and (6) performing a timing signoff of the layout at the optimization target voltage.

BRIEF DESCRIPTION

Reference is now made to the following descriptions taken in conjunction with the accompanying drawings, in which:

FIG. 6A to FIG. 6I are a set of contour plots of high, standard and low threshold voltage devices at FF, TT and SS corners; and FIG. 7 is a flow diagram of one embodiment of a method of designing an IC employing voltage scaling that uses standardized data to gauge the degree of optimization.

DETAILED DESCRIPTION

Figure 1:
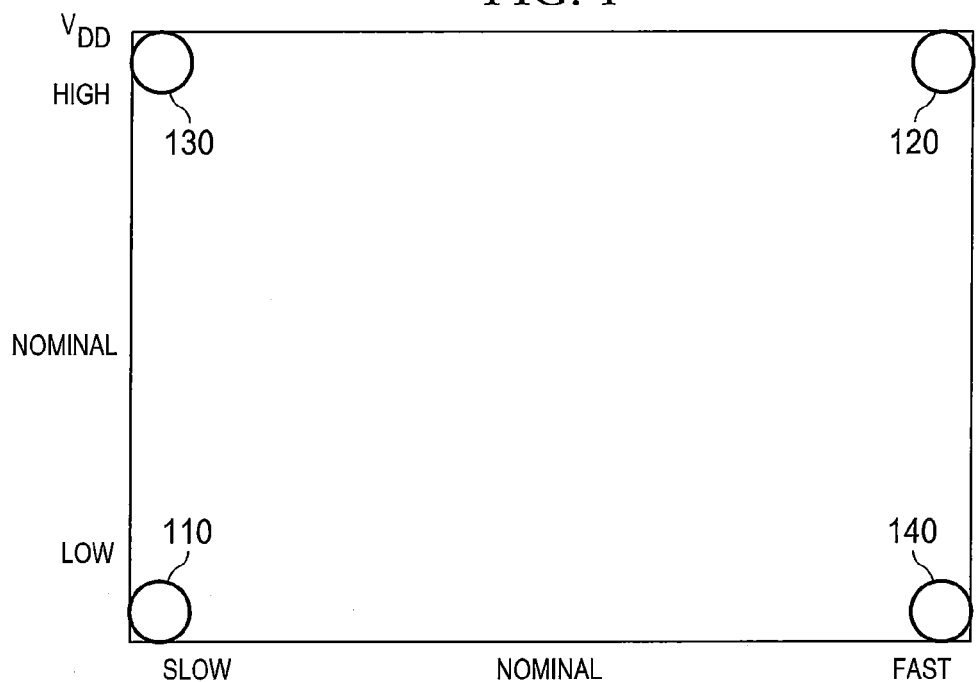
FIG. 1 is a graph of device drive voltage and device speed showing, in particular, traditional PVT corners with respect to an IC that does not employ voltage scaling.

Various embodiments of novel methods to be described below provide comprehensive, relevant data regarding the characteristics of different technology nodes advantageously to improve the degree to which the IC design process may be optimized. A technology node may refer, for example, to the scale (e.g., 40 nm, 65 nm or 100 nm) of the process employed to fabricate an IC or the substrate material (e.g., silicon, gallium arsenide or flexible substrate) interconnect material (e.g., metal or conductive polymer) or device type (e.g., transistor-transistor logic, or TTL, n-type or p-type metal-oxide semiconductor, or NMOS or PMOS, complementary metal-oxide semiconductor, or CMOS, bipolar transistor or field-effect transistor, or FET) employed in the IC.

As those skilled in the pertinent art understand, decisions regarding which technology node is to be employed in the design of an IC can only be made with some reference to the characteristics of the technology nodes that constitute the alternative choices. Representative devices are fabricated using each technology node and tested to generate the data that define the characteristics. Unfortunately, conventional techniques for analyzing the characteristics of different technology nodes are ad-hoc, providing only an incomplete view of key characteristics of the technologies. Moreover, the conventional techniques fail to provide a consistent framework for comparing the characteristics of different technology nodes. Described herein are methods that provide a comprehensive framework and tool-set for analyzing and comparing the characteristics of technology nodes. In some embodiments, a full sweep spanning relevant corners is performed on devices belonging to different technology nodes to generate a standardized databank, and contour analysis is performed on the data in order to understand each technology node relative to the other(s).

Voltage scaling is a technique whereby the drive voltage to a particular IC is modulated to one or more particular values such that the IC can function properly. Voltage scaling is particularly suited to compensate for process variations. Static voltage scaling may be performed at the factory (e.g., during calibration) or before the IC begins normal operation (e.g., during powerup initialization). In contrast, adaptive voltage scaling (AVS) is performed continually while the IC is in normal operation and particularly effective at compensating for temperature variations and device aging as well as process variations. ICs can have one or more domains, each having its own voltage regulator. Drive voltage can therefore be modulated separately in each domain, allowing compensation for OCV to be carried out as well.

While voltage scaling (including AVS) is known, it has heretofore been used only to compensate for process and temperature variations and aging in an IC that has been designed by a conventional method. What has not been realized until now, however, is that voltage scaling has the potential to change the fundamental theory under which an IC operates, and that, accordingly, the method by which an IC is designed may be transformed to take full advantage of the benefits of voltage scaling. Consequently, introduced herein are novel methods of designing ICs such that their performance, area, power consumption, yield or any combination of these may be realized beyond the limits of current design methods.

The comprehensive, relevant data produced by various embodiments of the methods described herein may be used to optimize the design of ICs employing voltage scaling (including AVS). However, since the methods herein may be carried out with reference to any set of relevant corners, the methods can also support the optimization of ICs that do not use voltage scaling, i.e., have a fixed drive voltage. Before describing various embodiments of the novel methods of standardized data creation, analysis and comparison of semiconductor technology node characteristics, various aspects of IC operation will be described, particularly with respect to ICs that do not and do employ voltage scaling and ICs that employ AVS.

FIG. 1 is a graph of device drive voltage and device speed showing, in particular, traditional PVT corners with respect to an IC not employing voltage scaling. FIG. 1 shows a "slow" corner 110 in which process variations are assumed to yield relatively slow-switching devices, and drive voltage and operating temperature are such that device switching speeds are their slowest. FIG. 1 also shows a "fast" corner 120 in which process variations are assumed to yield relatively fast-switching devices, and drive voltage and operating temperature are such that device switching speeds are their highest. The corners 110, 120 represent extremes. Setup violations result from signals propagating too slowly and arriving too late for subsequent use and are most likely to occur at the slow corner 110. Hold violations result from signals propagating too quickly and arriving too soon to be sustained for subsequent use and are most likely to occur at the fast corner 120. Conventional timing analysis is performed at the slow and fast corners 110, 120, since they represent the greatest challenge to IC operation.

It has also been determined that ICs operating with voltage scaling need not be subjected to timing analysis at the slow and fast corners 110, 120. Voltage scaling renders the slow and fast corners 110, 120 irrelevant. An IC employing voltage scaling (and particularly AVS) does not operate in these corners. Instead, as will be shown, other corners bound the operation of an IC employing voltage scaling. As stated above, it has been realized that the method by which an IC is designed may be modified to take advantage of this fact. Instead of selecting circuit configurations (e.g., architectures and data-path widths) and devices and closing timing at the slow and fast corners 110, 120, the IC design process can instead focus on more fundamental design objectives: power, performance, area, yield or any combination of these.

Figure 2:
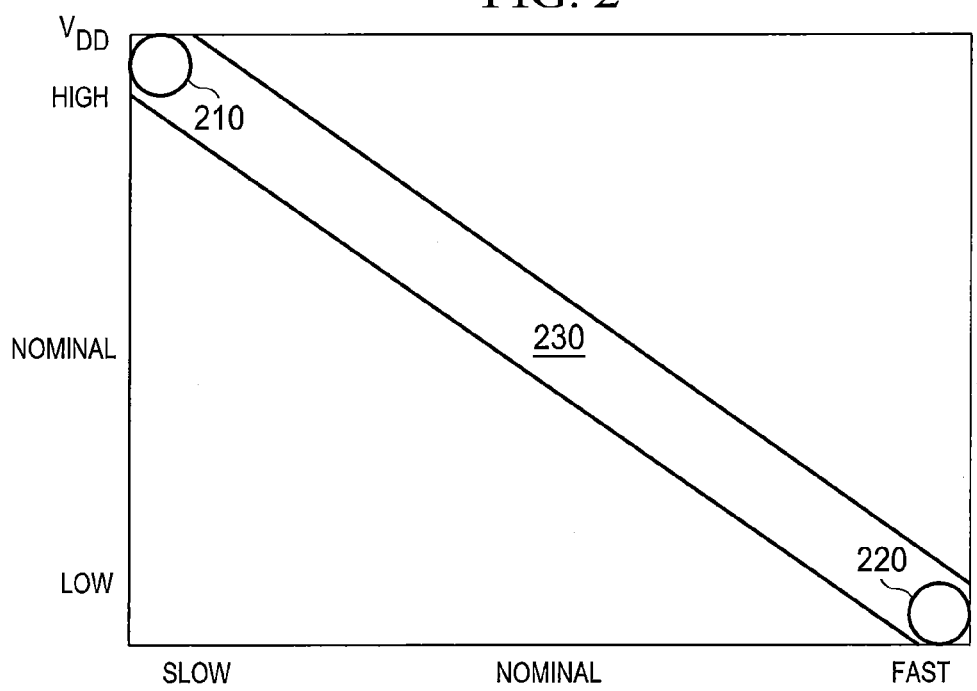
FIG. 2 is a graph of device drive voltage and device speed showing, in particular, PVT corners relevant to voltage scaling.

FIG. 2 is a graph of device drive voltage and device speed showing, in particular, corners relevant to voltage scaling. FIG. 2 shows a first corner 210 in which process variations are assumed to yield relatively slow-switching devices, and temperatures are such that device switching speeds are at their slowest. However, under such conditions, voltage scaling compensates for this inadequate speed by setting drive voltage at its highest level, increasing speed to an acceptable level. FIG. 2 also shows a second corner 220 in which process variations are assumed to yield relatively fast-switching devices, and temperatures are such that device switching speeds are at their highest. However, under such conditions, voltage scaling compensates for this excessive speed by setting drive voltage at its lowest level, decreasing speed to an acceptable level. Given OCV and temperature variations over the area of an IC, a region 230 results. It has been determined that IC design efforts are best spent on optimizing performance in the region 230. In one embodiment, IC design efforts are focused exclusively in the region 230.

The method introduced herein can also be applied in a reduced risk manner by creating extended safe-zones of operation. In addition, AVS can be employed to introduce over-drive (e.g., to about 110% $V_{DD}$) and under-drive (e.g., to about 90% $V_{DD}$). Of course, other ranges of over- and under-drive may be employed in alternative embodiments. Furthermore, over- and under-drive need not be the same. AVS gives the IC designer the ability to choose a desired optimization target in a safe-zone as will now be shown.

Figure 3:
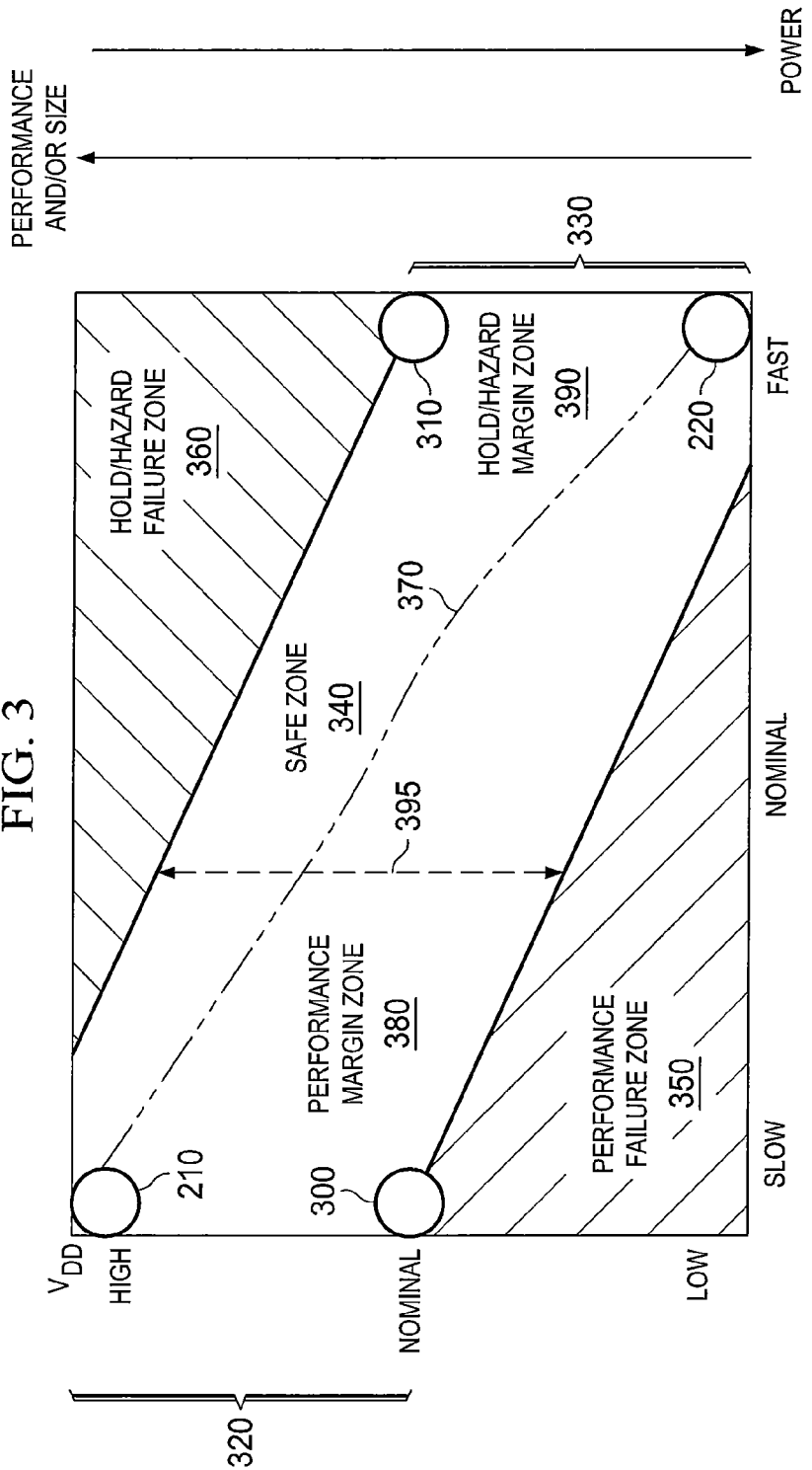
FIG. 3 is a graph of device drive voltage and device speed showing, in particular, performance failure, hold/hazard failure and safe operating zones for an IC employing voltage scaling.

FIG. 3 is a graph of device drive voltage and device speed showing, in particular, performance failure, hold/hazard failure and safe operating zones for an IC employing voltage scaling. FIG. 3 shows the first and second corners 210, 220 of FIG. 2. FIG. 3 also shows third and fourth corners 300, 310. The third corner 300 represents a nominal drive voltage $V_{DD}$ applied to an IC in which process variations are assumed to yield relatively slow-switching devices and temperatures are such that device switching speeds are at their slowest. The fourth corner 310 represents a nominal drive voltage $V_{DD}$ applied to an IC in which process variations are assumed to yield relatively fast-switching devices and temperatures are such that device switching speeds are at their highest. A span 320 represents a range of over-drive, and a span 330 represents a range of under-drive. Thus, the first, second, third and fourth corners 210, 220, 300, 310 define a safe zone 340 of operation for an IC within which AVS is capable of scaling drive voltage to maintain proper IC operation.

A performance failure zone 350 lies below the safe zone 340 and encompasses operating conditions in which setup failures would occur. A hold/hazard failure zone 360 lies above the safe zone 340 and encompasses operating conditions in which hold failures would occur. An operating line 370 representing the points of actual operation of a particular IC lies within the safe zone 340 and is, as expected, bounded on its ends by the first and second corners 210, 220. The operating line 370 divides the safe zone 340 into a lower, performance margin zone 380 and an upper, hold/hazard margin zone 390. The lower, performance margin zone 380 represents a margin by which the operating line 370 is separated from the performance failure zone 350. This margin comes at the cost of performance: performance is lower, and power and area are higher, than optimal. The upper, hold/hazard margin zone 390 represents a margin by which the operating line 370 is separated from the hold/hazard failure zone 360. This margin comes at the cost of additional buffering needed to hold signals pending subsequent use.

The graph of FIG. 3 reveals several aspects of optimization that may be exploited. First, as an upwardly pointing arrow to the right of the graph of FIG. 3 indicates, the performance of the IC may be increased, or the area of the IC may be decreased, by reducing the performance margin zone 380. Second, as a downwardly pointing arrow to the right of the graph of FIG. 3 indicates, the power consumed by the IC may be decreased by reducing the hold/hazard margin zone 390. Consequently, optimizing the design of an IC in terms of performance, power and area amounts to minimizing the width (indicated by a line 395) of the safe zone 340. As a result, power consumption may be reduced (fast devices can operate at a lower drive voltage), smaller cells (of less area) may be used, further reducing power consumption to meet the same performance (slow devices can operate at a higher drive voltage), and the performance of the IC can be increased by avoiding the slow corner 110 of FIG. 1, allowing the IC to be run faster than previously (slow devices can operate at a higher drive voltage). Furthermore, IC design and test time ("turn-around-time") can be decreased due to reduced CAD tool run-times and ease in achieving existing performance requirements. Process variations may also be reduced, and yields increased, in IC designs implemented at non-worst-case corners.

The challenge in any optimization is avoiding local optimizations. In other words, the optimization should be with respect to as many alternatives as possible. In the context of the above-described optimization opportunity, optimizing the design of an IC in terms of performance, power, area and yield is best carried out with respect to multiple technology nodes. Important to this objective is a technique for gathering, analyzing and presenting standardized data such that the technology nodes are comparable.

Figure 4:
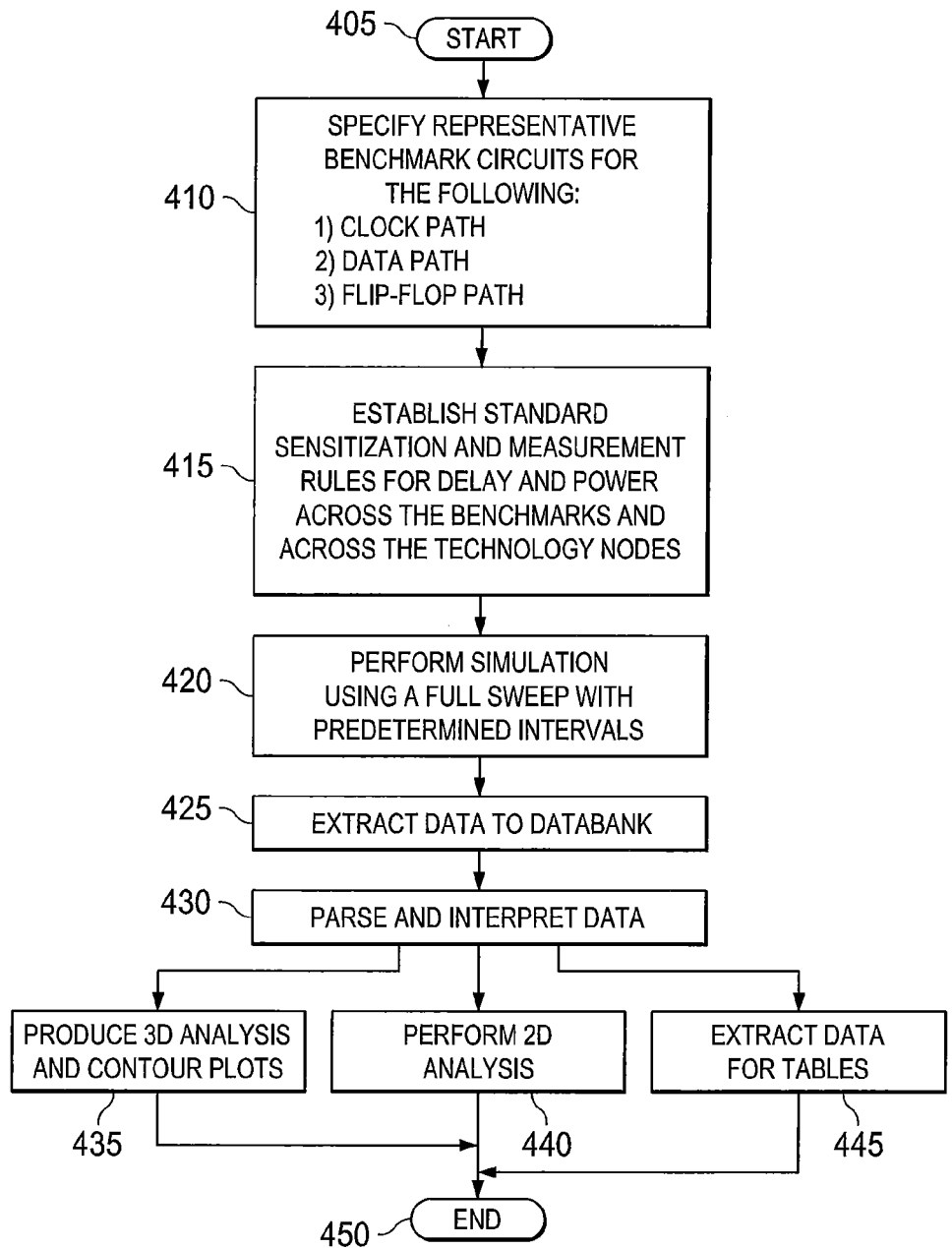
FIG. 4 is a flow diagram of one embodiment of a method of standardized data creation, analysis and comparison of semiconductor technology node characteristics.

FIG. 4 is a flow diagram of one embodiment of a method of standardized data creation, analysis and comparison of semiconductor technology node characteristics. The method begins in a start step 405. In a step 410, representative benchmark circuits are designed to represent a typical clock path, a typical data path and a typical flip-flop path. In each case, interconnects couple various devices, e.g., to model the degradation in signal transition due to changes in the RC time-constant associated with the interconnect resulting from either or both of temperature and process variations. In the particular case of a flip-flop path, the devices are coupled such that they form at least one flip-flop, and clock signals are used to step data through the flip-flop path. In the illustrated embodiment, each of the benchmark circuits include variations in drive strength and loading (both gate and interconnect) to cover several cases. Table 1, below, sets forth examples of clock, data and flip-flop paths that was used to produce graphs set forth in FIGS. 5 and 6, below.

TABLE 1

Examples of Clock, Data and Flip-Flop Paths

| Benchmark Circuit | Circuit Details | Strength | Loads | Target Libraries |
|---|---|---|---|---|
| Clock Path | in<br>->clkinv_1<br>->clkinv_2<br>->...<br>->clkinv_10<br>->out | X2<br><br><br>X8 | gate-load,<br>wires: 5 u,<br>20 u, 50 u<br>gate-load,<br>wires: 5 u,<br>20 u, 200 u | P and D |
| Data Path | in<br>->inv<br>->nor3<br>->oai21<br>->nand2<br>->nor2<br>->nand3<br>->aoi21<br>->inv<br>->buf<br>->out | X1<br><br><br>X8 | gate-load,<br>wires: 5 u,<br>20 u, 50 u<br>gate-load,<br>wires: 5 u,<br>20 u, 200 u | |
| Flip-Flop Path | (in, clk)<br>->flop<br>->buf<br>->out | X1<br><br><br>X4 | gate-load,<br>wires: 5 u,<br>20 u, 50 u<br>gate-load,<br>wires: 5 u,<br>20 u, 200 u | P only (flip-flops not available in D) |

In a step 415, standard sensitization and measurement rules for delay and power are established across the benchmarks, across the corners and over the technology nodes that are to be considered as alternatives for IC design. For example, a standard sensitization may call for a repetitive pulse having a 50% duty cycle and a 16 nm period and a flip-flop clock period of 8 ns, and a standard measurement may call for measurement of performance and power consumption (leakage and dynamic). In a step 420, a simulation is performed by sweeping through a range of values and at predetermined intervals from each corner to the others. In the illustrated embodiment, the sweep is full, performed from one expected corner to the other. For example, process variables may be swept from, for example, slow (hss), through typical (htt), to fast (hff), resulting in three steps; drive voltage may be swept from −20% of nominal $V_{DD}$ to +20% of nominal $V_{DD}$ in 10 mV steps, resulting in, e.g., 400 steps if nominal $V_{DD}$=1.00V; and temperature may be swept from −40° C. to +135° C. in 5° C. steps, resulting in 20 steps. As a result, 24,000 points of data are gathered from the example simulation. In the context of an IC that does not employ voltage scaling, sweeping may occur from a slow corner to a fast corner (e.g., the slow and fast corners 110, 120 of FIG. 1). In the context of an IC that does employ voltage scaling (including AVS), sweeping may occur among various corners that define a safe zone (e.g., the safe zone 340 of FIG. 3).

In many practical applications, far more than one simulation may be performed. For example, more than 1000 simulations may be performed to collect data on each technology node using only three process points per node. The number of simulations can be much higher were skewed process points to be used. Computer programming may be used along with conventional CAD simulation tools to carry out automated circuit generation, multiple simulations, automated parsing, automated databanking and automated report/plot generation. The reports described herein are only examples of the many different kinds of reports that can be generated.

In a step 425, the data are extracted from the simulation and written to a databank. The databank may take any form whatsoever. In one embodiment, the number of simulations required for benchmarking are extremely large, and considerable computer-aided automation (via programming) is carried out to generate and consolidate the databank. In a step 430, the data are parsed and interpreted as needed to produce reports that may take various forms. For example, in a step 435, a 3D analysis and contour plots may be produced from the data. One embodiment employs considerable computer-aided automation to generate plots from the databank. In a step 440, a 2D analysis may be performed on the data. In a step 445, tables may be formed of extracted data. The method ends in an end step 450.

Having described various embodiments of a method of standardized data creation, analysis and comparison of semiconductor technology node characteristics, examples of contour plots illustrating examples of data will now be described.

Figure 5A:
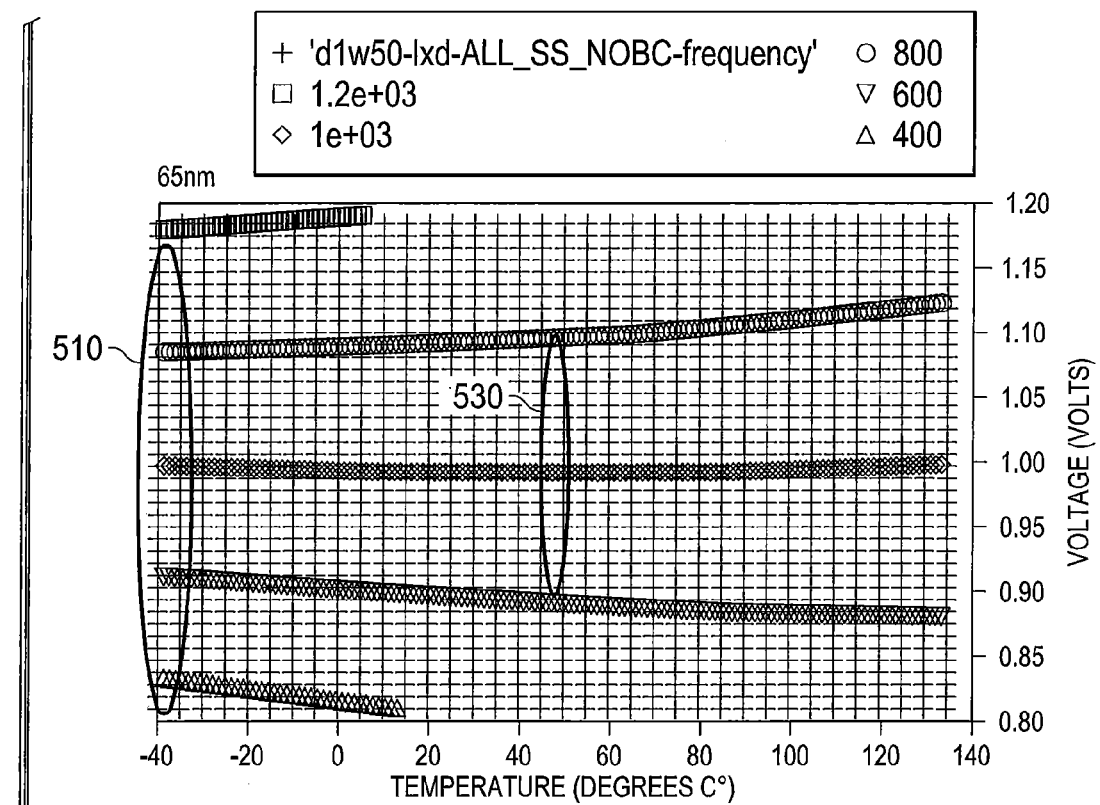
FIG. 5A and FIG. 5B are a pair of contour plots for one example of a device fabricated according to 65 nm and 40 nm technologies, respectively.
Figure 5B:
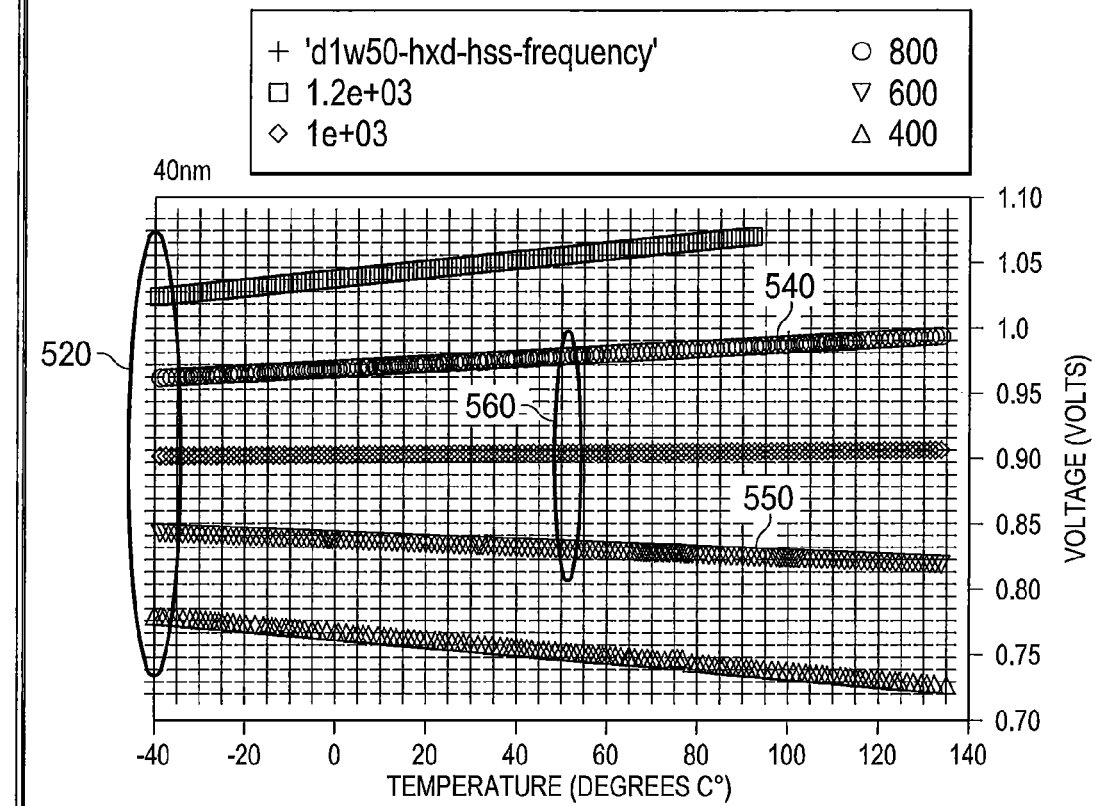
Figure 6A:
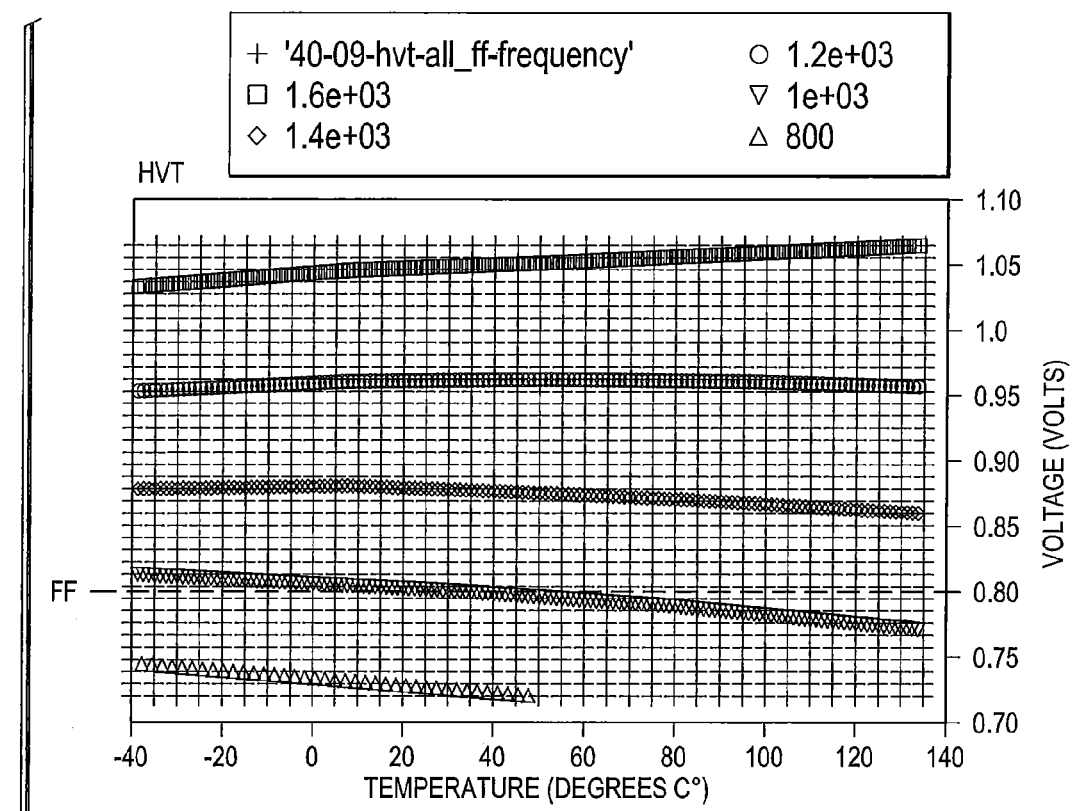
Figure 6B:
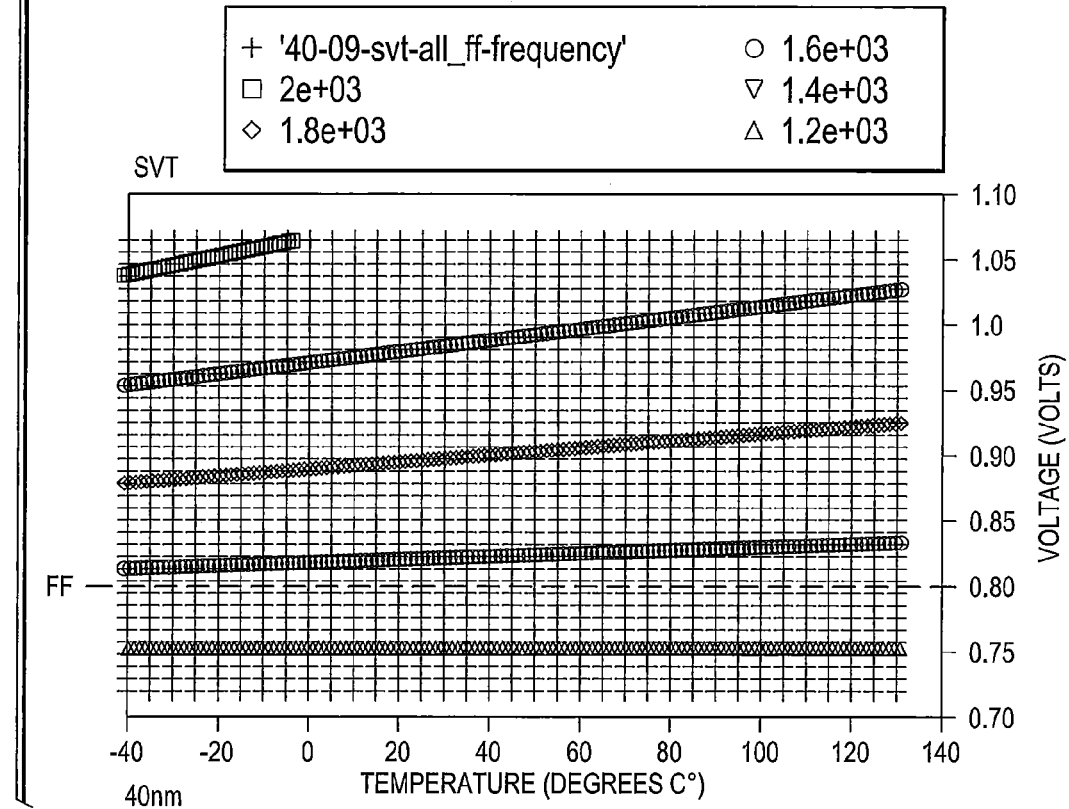
Figure 6C:
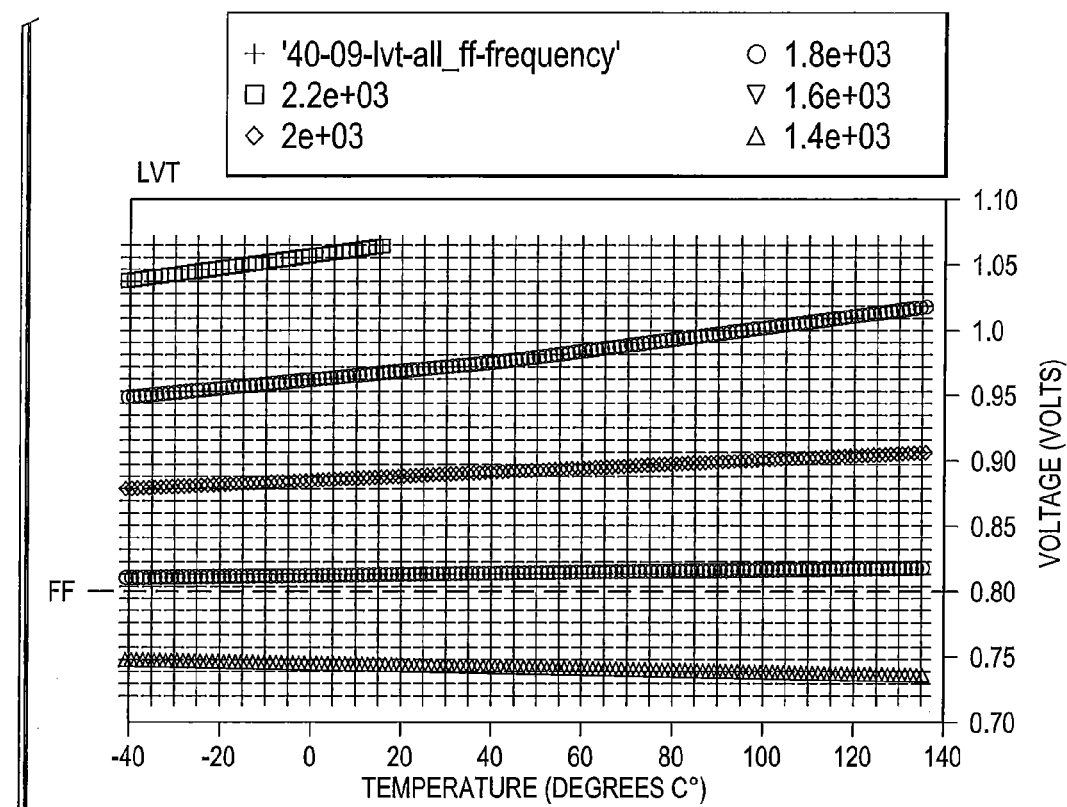
Figure 6D:
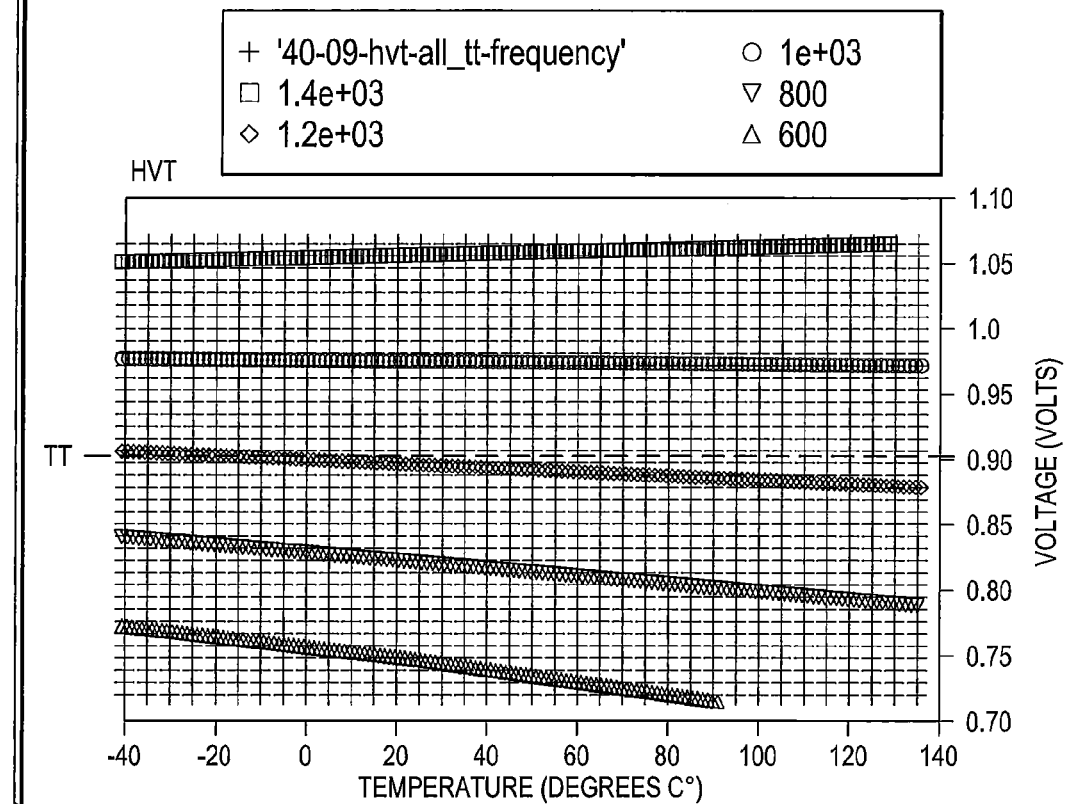
Figure 6E:
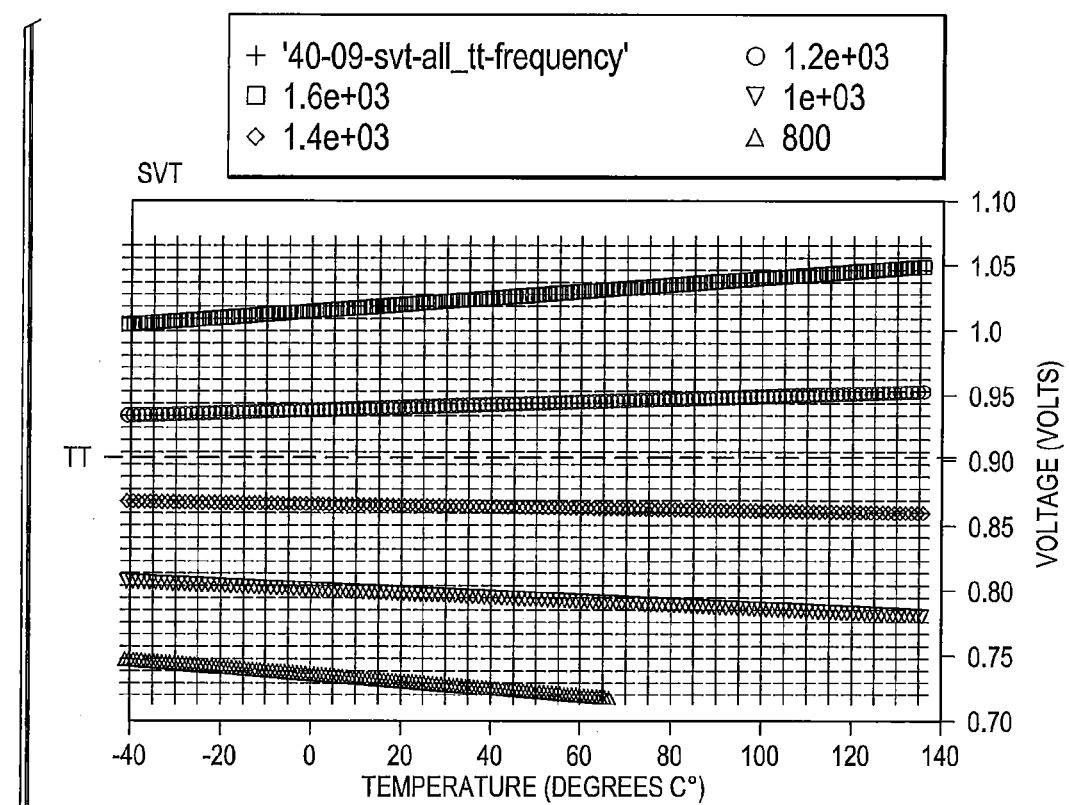
Figure 6F:
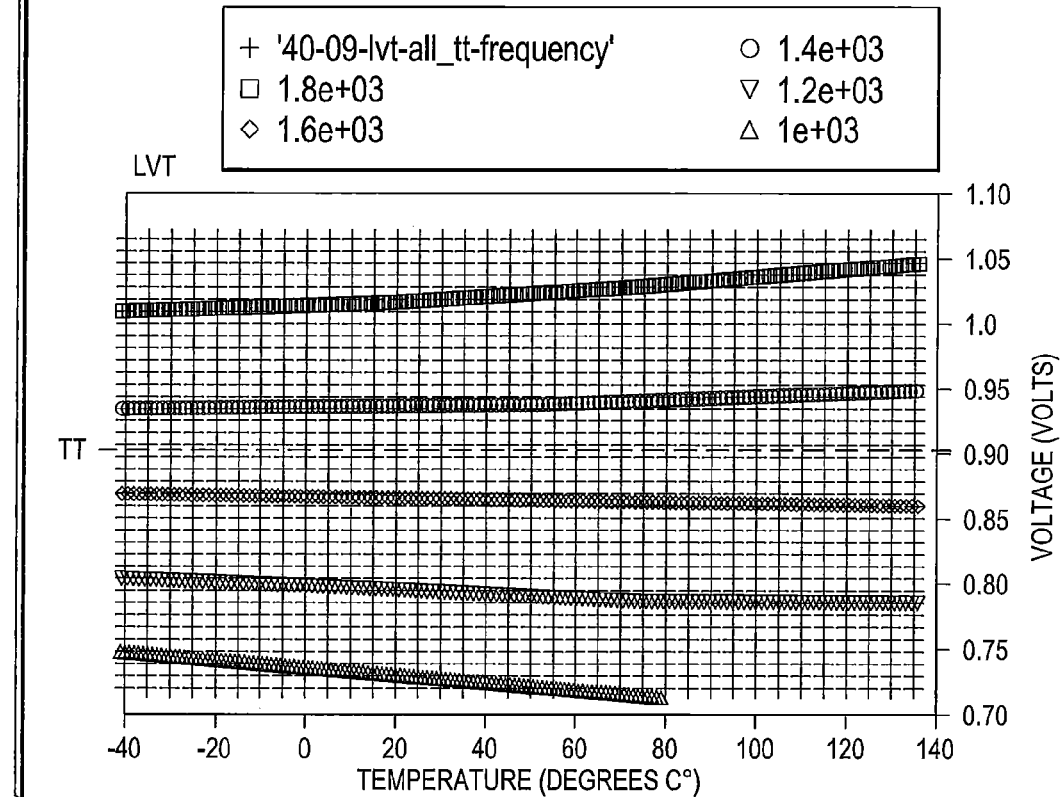
Figure 6G:
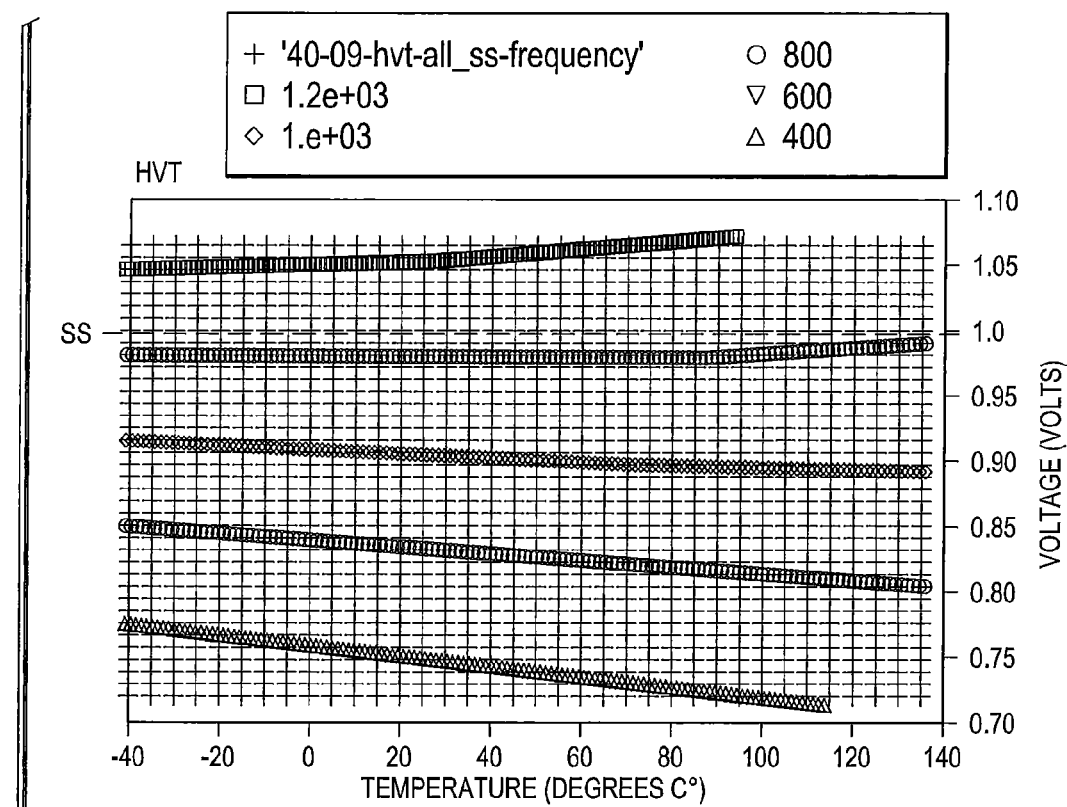
Figure 6H:
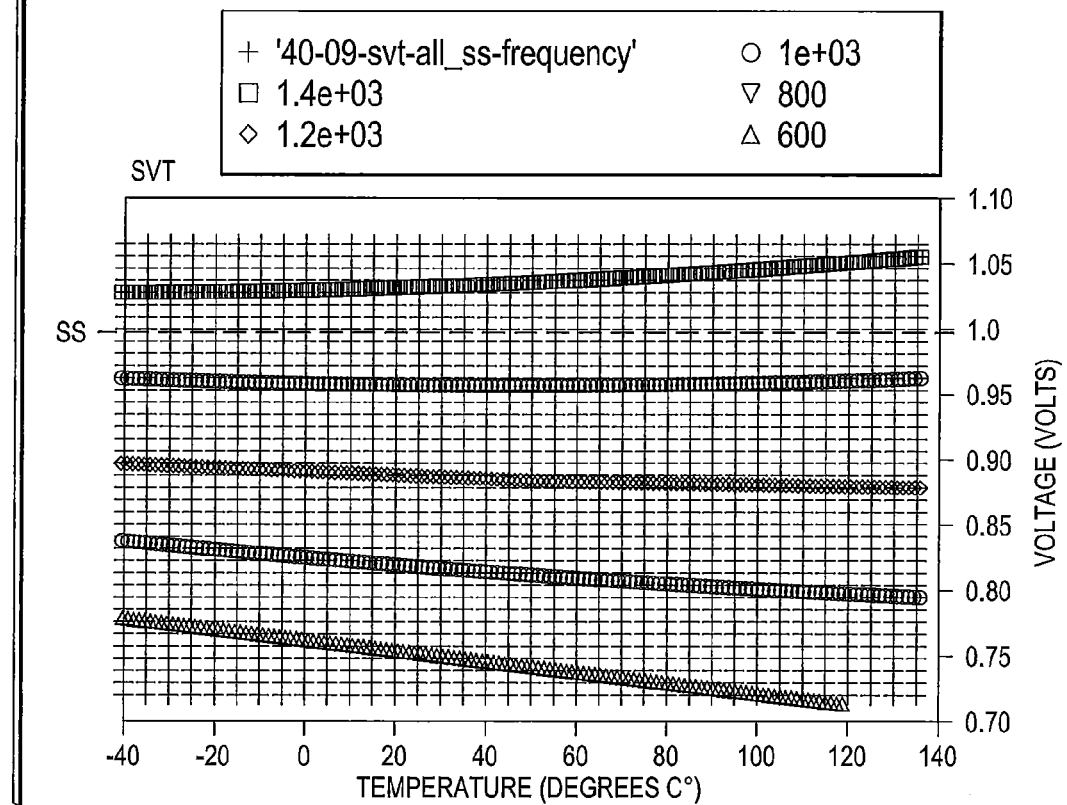

FIG. 5A and FIG. 5B are a pair of contour plots for one example of a device fabricated according to 65 nm and 40 nm technology nodes, respectively. Comparing highlighted areas 510, 530 indicates an increased contour density at the 65 nm technology node and therefore a higher drive voltage sensitivity. A highlighted area 530 indicates an approximately 57% increase in performance as drive voltage increases from −10% of nominal $V_{DD}$ to +10% of nominal $V_{DD}$. A comparison of contour slopes 540, 550 reveals temperature inversion and drive voltage sensitivity at the 40 nm technology node. A highlighted area 560 indicates an approximately 82% increase in performance as drive voltage increases from −10% of nominal $V_{DD}$ to +10% of nominal $V_{DD}$. These facts provide insights regarding the relative advantages and disadvantages of selecting devices in the 65 nm versus the 40 nm technology node that conventional, ad-hoc techniques for analyzing the characteristics of different technology nodes fail to reveal.

FIG. 6A to FIG. 6I are a set of contour plots of high, typical and low threshold voltage devices at FF, TT and SS corners. HVT designates the high threshold voltage devices, SVT designates the typical threshold voltage devices, and LVT designates the low threshold voltage devices. Shown are contours from which to gain an understanding of temperature and voltage sensitivity of these devices at the 45 nm technology node.

FIG. 7 is a flow diagram of one embodiment of a method of designing an IC employing voltage scaling that uses standardized data to gauge the degree of optimization. The method begins in a start step 705. In a step 710, performance objectives are determined. The performance objectives may be expressed in terms of a target data throughput, a target clock frequency, a target die size, a target overall power consumption, a target yield percentage or any other conventional or later-determined performance objective. In a step 715, an optimization target voltage is determined. For example, a particular IC design may have an optimization target voltage of 1.7V. However, all optimization target voltages are within the scope of the invention. In a step 720, a decision is made as to whether voltage scaling is needed. The performance objectives defined above may be such that additional voltage scaling (or AVS) circuitry may not be needed. If voltage scaling is not needed, a conventional IC design method may then be employed.

However, the flow diagram of FIG. 7 assumes that voltage scaling is needed. In a step 725, a decision is made as to whether the voltage scaling is to be static (non-AVS) or adaptive (AVS). The result of the decision of the step 725 determines the PVT corners and libraries that are to be used in generating a netlist. In a step 730, a functional IC design and a register transfer logic (RTL representation) representation of that IC design are generated. Those skilled in the pertinent art understand how to generate a functional IC design and an RTL representation based thereon.

In a step 735, the RTL representation is synthesized to yield a netlist using the optimization target voltage. The synthesis is performed with reference to standardized data, created by employing one of the above-described embodiments, to judge optimization. Those skilled in the pertinent art are familiar with the construction and content of libraries of IC devices in general and are aware that such libraries contain standard implementations, along with physical attributes, of devices that can be implemented in an IC. Some attributes are largely independent of fabrication process variation, including the numbers and locations of device terminals, the shape and size of the device footprint and the numbers and types of process steps that should be undertaken to fabricate the device and process-dependent attributes. Other attributes vary, such as the switching speed of the device (if it is a transistor), the drive voltage of the device, the current-handling capability of the device and the power consumption of the device. As described above, the process-dependent attributes of the library are determined with reference to PVT corners; the PVT corners of a library employed to design an IC that implements voltage scaling are different from those of a conventional library. In general, since voltage scaling renders conventional, more extreme, PVT corners irrelevant, design margins can be relaxed, and greater flexibility exists with respect to the selection of devices to be used in an IC.

During the synthesis of the RTL representation into the netlist, fundamental decisions may be made regarding the architecture of the IC, including its logic circuits. Those skilled in the pertinent art understand that logic circuits may be optimized in different ways. An IC may need to perform a multiply function. However, that multiply function may be implemented with different multiplier architectures. Multipliers having wide datapaths (parallel units) may be faster but consume more power and area than multipliers having narrower datapaths (e.g., a single unit with intermediate result feedback). The RTL representation may be generated with reference to a library containing more than one architecture for various logic circuits, and choices among those architectures may be made based on the greater latitude afforded by static voltage scaling or AVS.

In a step 740, devices are placed, a clock tree is synthesized, and routing is determined according to the RTL representation and at the optimization target voltage. In a step 745, a timing signoff is performed at the optimization target voltage. Those skilled in the pertinent art understand how to perform timing signoff at a given drive voltage. The method ends in an end step 750.

Those skilled in the art to which this application relates will appreciate that other and further additions, deletions, substitutions and modifications may be made to the described embodiments.

What is claimed is:

1. A method of designing an integrated circuit, comprising:
   generating, using a computer, a functional design for said integrated circuit;
   determining performance objectives for said integrated circuit;
   determining an optimization target voltage for said integrated circuit;
   determining whether said integrated circuit needs voltage scaling to achieve said performance objectives at said optimization target voltage and, if so, whether said integrated circuit is to employ static voltage scaling or adaptive voltage scaling;
   using said optimization target voltage to synthesize a layout from said functional integrated circuit design that meets said performance objectives by employing standardized data created by designing at least one representative benchmark circuit, establishing standard sensitization and measurement rules for delay and power for said at least one representative benchmark circuit and across corners in said technology nodes, performing a simulation by sweeping through a range of values and at predetermined intervals across said corners, extracting data from said simulation, and parsing and interpreting said data to produce at least one report; and
   performing a timing signoff of said layout at said optimization target voltage.

2. The method as recited in claim 1 wherein said using comprises:
   using said optimization target voltage to synthesize a netlist from said functional integrated circuit design that meets said performance objectives; and
   generating a layout of said integrated circuit from said netlist.

3. The method as recited in claim 1 wherein said performance objectives include one selected from the group consisting of:
   a target power consumption,
   a target area, and
   a target speed.

4. The method as recited in claim 1 wherein said using comprises:
   synthesizing a clock tree for said integrated circuit; and
   determining a routing at said optimization target voltage.

5. The method as recited in claim 1 wherein said determining whether said integrated circuit needs said voltage scaling is carried out with respect to more than one fabrication technology, said performance/power ratio being unitless.

6. The method as recited in claim 1 wherein said adaptive voltage scaling is capable of being carried out without software control.

7. The method as recited in claim 1 wherein said using comprises decreasing an area of a safe zone associated with said integrated circuit.

8. A method of designing an integrated circuit, comprising:
generating, using a computer, a functional design for said integrated circuit;
determining performance objectives for said integrated circuit;
determining an optimization target voltage for said integrated circuit;
determining whether said integrated circuit needs voltage scaling to achieve said performance objectives at said optimization target voltage and, if so, whether said integrated circuit is to employ static voltage scaling or adaptive voltage scaling;
using said optimization target voltage to synthesize a layout from said functional integrated circuit design that meets said performance objectives by employing standardized data created by designing at least one representative benchmark circuit; and
performing a timing signoff of said layout at said optimization target voltage.

9. The method as recited in claim 8 wherein using said optimization target voltage to synthesize said layout includes establishing standard sensitization and measurement rules for delay and power for said at least one representative benchmark circuit and across corners in technology nodes considered for said functional integrated circuit design.

10. The method as recited in claim 8 wherein using said optimization target voltage to synthesize said layout includes performing a simulation by sweeping through a range of values and at predetermined intervals across corners, extracting data from said simulation, and parsing and interpreting said data to produce at least one report.

* * * * *